(12) United States Patent
Osburn

(10) Patent No.: US 6,430,043 B1
(45) Date of Patent: Aug. 6, 2002

(54) HEAT SINK GROUNDING UNIT

(75) Inventor: Edward P. Osburn, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/699,861

(22) Filed: Oct. 30, 2000

(51) Int. Cl.$^7$ ................................................ H05K 5/00
(52) U.S. Cl. ................ 361/687; 361/699; 361/700; 165/104.21; 174/15.2
(58) Field of Search .............................. 361/686, 687, 361/699, 700, 704, 707; 364/708.1; 165/80.4, 104.33, 104.21; 62/259.2; 174/15.2

(56) References Cited

U.S. PATENT DOCUMENTS

| | | | |
|---|---|---|---|
| 5,907,471 A | 5/1999 | Patel et al. ................. 361/500 |
| 5,917,708 A | 6/1999 | Moran et al. ................ 361/800 |
| 5,965,842 A | 10/1999 | Ganninger et al. ....... 174/35 R |
| 6,172,872 B1 * | 1/2001 | Katsui ......................... 361/695 |
| 6,181,553 B1 * | 1/2001 | Cipolla et al. .............. 361/687 |
| 6,243,265 B1 * | 1/2001 | Wong et al. ................. 361/704 |

* cited by examiner

Primary Examiner—Darren Schuberg
Assistant Examiner—Hung Van Duong
(74) Attorney, Agent, or Firm—Schwegman, Lundberg, Woessner & Kluth, P.A.

(57) ABSTRACT

A electromagnetic interference (EMI) grounding unit provides an electrical connection between a heat sink and a ground formed on a substrate. A tab mechanically and electrically continuous with an electrically conductive generally planar member makes electrical contact with the heat sink. The electrically conductive generally planar member is connected to one or more conductive posts. And the one or more conductive posts are connected to the ground. An electrical charge on the heat sink is discharged along a path that includes the tab, the electrically conductive generally planar member, and the one or more posts. Discharging accumulated charge on the heat sink to ground reduces EMI generated by re-radiation of electromagnetic energy from the heat sink.

28 Claims, 9 Drawing Sheets

HEAT SINK GROUNDING UNIT

FIELD

The present invention relates to reducing electromagnetic interference (EMI) in electronic systems, and more particularly, to reducing secondary EMI emitted from a heat sink.

BACKGROUND

Electronic systems include current-carrying paths. For example, integrated circuits, such as processors used in personal computers and other electronic products, include current-carrying paths that connect electronic components, such as resistors, capacitors, and transistors, together. In addition, the substrates and circuit boards on which integrated circuits are packaged include current-carrying paths. As currents are switched on and off along current-carrying paths, electromagnetic radiation, which is sometimes referred to as electromagnetic interference (EMI), is radiated from these paths. Current-carrying paths that emit EMI are often referred to as primary EMI sources. EMI may also be re-radiated from a conductor that absorbs electromagnetic radiation. For example, an ungrounded heat sink that is thermally coupled to a processor can absorb electromagnetic radiation from the processor and re-radiate the absorbed radiation. Sources of re-radiated EMI are often referred to as secondary EMI sources.

EMI generated by either primary or secondary sources can interfere with electronic signals from other devices, such as those in communication systems. In the United States, the Federal Communications Commission (FCC) sets limits on EMI emitted by electronic devices. In other countries, agencies similar to the FCC also set limits on EMI emissions. To avoid exceeding the EMI emission limits set by government agencies, the manufacturers of electronic devices have developed shielding and grounding schemes to reduce the EMI emitted by electronic devices.

One shielding scheme used to reduce EMI in electronic systems requires completely surrounding the electronic system with a conductive shield connected to a ground. The shield is typically fabricated in as a single component having fixed mounting locations and which absorbs EMI produced by the electronic system. The absorbed EMI causes electrical charge to accumulate on the shield, and the ground connection provides a discharge path for the accumulated charge. Unfortunately, a shield designed as a single component having fixed mounting locations often interferes with the layout and packaging of other components in a system.

One grounding scheme for reducing secondary EMI that does not interfere with the layout and packaging of components in a system including a processor and a heat sink has two manufacturing steps. First, one end of a ground wire is attached to the heat sink. Second, the other end of the ground wire is attached to a ground connection. The ground wire is typically attached to the heat sink and ground connection using screws. This grounding scheme provides a reliable method of reducing some EMI, but the scheme has two disadvantages. First, the installation of the ground wire is labor intensive and therefore very expensive. Second, the ground wire is only effective at reducing EMI at low frequencies. For modem processors operating at high frequencies, this grounding scheme is ineffective.

For these and other reasons there is a need for the present invention.

DESCRIPTION

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 1:
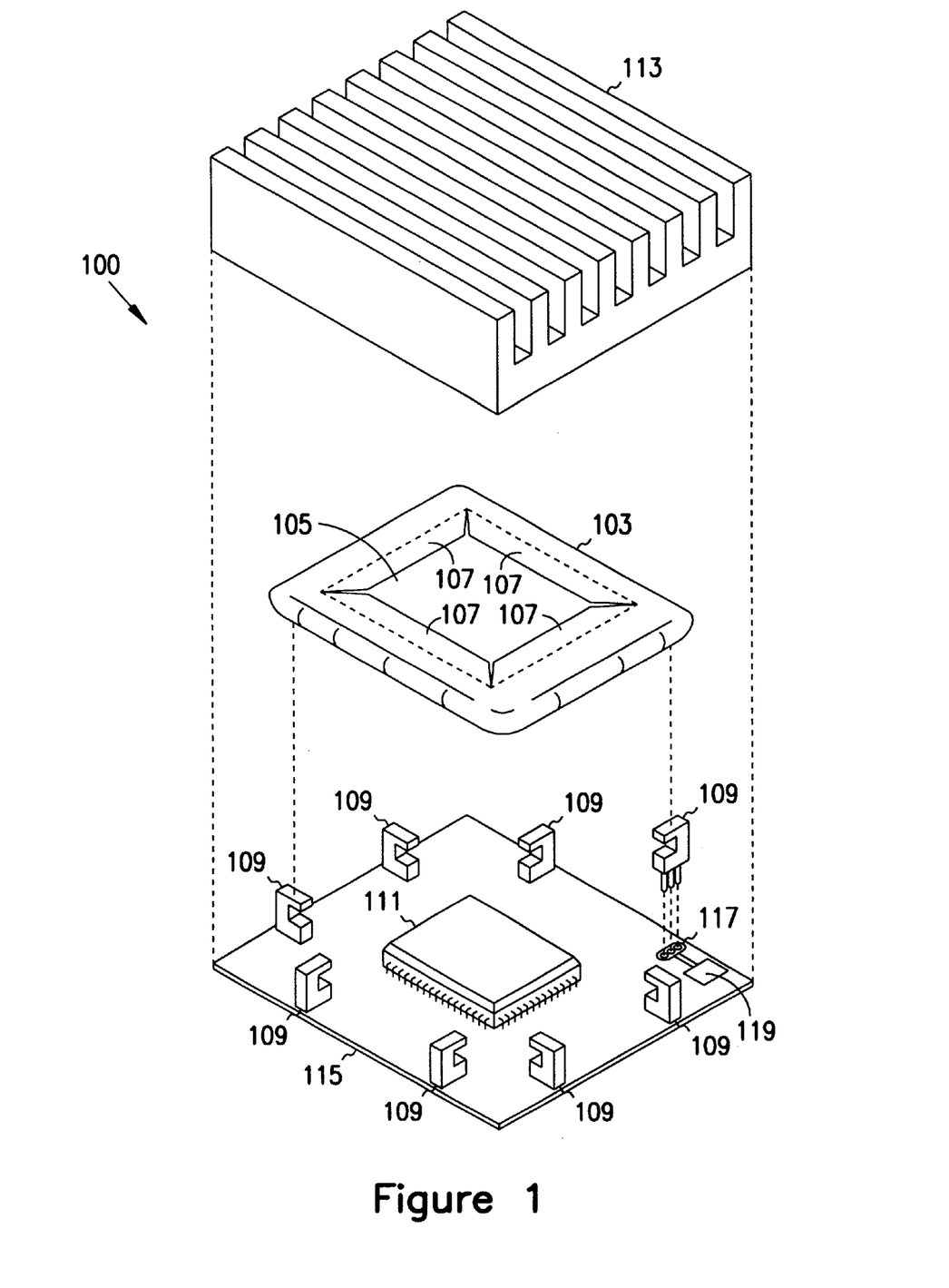
FIG. 1 is an exploded view of one embodiment of an electromagnetic interference (EMI) grounding unit according to the present invention.

FIG. 1 is an exploded view of one embodiment of an electromagnetic interference (EMI) grounding unit 100 according to the present invention. The EMI grounding unit 100 comprises an electrically conductive generally planar member 103 including a central aperture 105, one or more tabs 107, and one or more posts 109. Each of the one or more tabs 107 is electrically and mechanically continuous with the electrically conductive generally planar member 103.

When the EMI grounding unit 100 is assembled with a die 111, a heat sink 113, and a substrate 115, each of the one or more posts 109 is mechanically and electrically coupled to at least one ground connection 117 coupled to a ground 119 formed in or on the substrate 115. Each of the one or more posts 109 engages the electrically conductive generally planar member 103 to space the electrically conductive generally planar member 103 from and above the substrate 115. Each of the one or more posts 109 positions the central aperture 105 over and in alignment with the die 111 mounted on the substrate 115. Each of the one or more tabs 107 makes electrical contact with the heat sink 113, and the electrically conductive generally planar member 103 makes electrical contact with the one or more posts 109. Thus, the one or more tabs 107, the electrically conductive generally planar member 103, and the one or more posts 109 provide a conductive path between the heat sink 113 and the one or more ground connections 117 for discharging the heat sink 113.

The die 111 is mounted on the substrate 115 and typically includes an electronic circuit, such as a processor, fabricated on a substrate, such as a semiconductor. The present invention is not limited to use in connection with a particular type of electronic circuit fabricated on the die 111. Any circuit, such as a processor, a digital signal processor, or an application specific integrated circuit, that is used in combination with a heat sink is suitable for use in connection with the present invention. The present invention is also not limited to use in connection with the die 111 fabricated from a particular type of material. Any material, such as a semiconductor, which is suitable for use in fabricating integrated circuits, is suitable for use as a substrate for the die 111. Exemplary semiconductors suitable for use in connection with the present invention include silicon, germanium, and gallium arsenide. The die 111 may be mounted directly on the substrate 115 or the die 111 may be packaged in a protective housing prior to mounting on the substrate 115. Alternatively, the die 111 or a protectively packaged die 111 may be mounted in a socket mounted on the substrate 115.

The heat sink 113 is thermally coupled to the die 111 and provides a path to remove heat from the die 111. The heat sink 113 is preferably thermally coupled to the die 111 by attaching the heat sink 113 to the die 111 using a thermally conductive adhesive. The present invention is not limited to use in connection with a heat sink fabricated from a particular material. The heat sink 113 is typically fabricated from a conductive material. In one embodiment, the heat sink 113 is fabricated from copper or a copper alloy. In an alternate embodiment, the heat sink 113 is fabricated from aluminum or an aluminum alloy. The present invention is not limited to use in connection with a heat sink having a particular shape. Preferably, the heat sink 113 has a large surface area for radiating heat to a medium surrounding the heat sink 113. In one embodiment, the heat sink 113 comprises a conductive plate thermally coupled to the die 111. In an alternate embodiment, the heat sink 113 comprises a conductive plate having one or more fins projecting upward from the plate for radiating heat to a surrounding medium.

The substrate 115 provides a base for mounting the die 111 and is generally comprised of a network of conductors formed on a non-conductive material. The conductors are typically comprised of interconnects, such as copper interconnects, that are formed on the surface of the non-conductive material, typically a glass epoxy or ceramic substrate, or embedded within the substrate. Interconnects are conductive elements that provide an electrical connection between electronic components, such as resistors, capacitors, transistors, diodes, and integrated circuits. Multiple layers of interconnects can be formed in the substrate 115 by laminating the interconnects between layers of the non-conductive material. Electronic components can be attached to the conductors on the substrate 115 by soldering or other attachment methods. A separate conductor capable of functioning as the ground 119 can be formed in the substrate 115 to provide for ground connections to components mounted on the substrate 115 through the one or more ground connections 117.

FIGS. 2A–2D show a perspective view of some embodiments of the one or more posts 109 shown in FIG. 1. Each of the one or more posts 109 comprises a body 204 having a notch 206 and one or more leads 208.

Figure 2A:
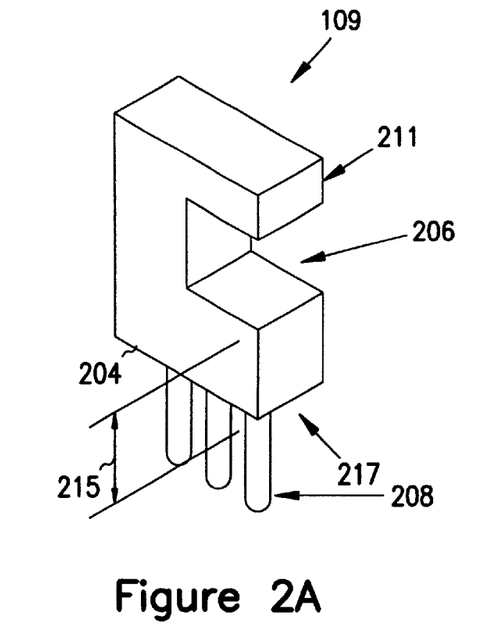
FIGS. 2A–2D are perspective views of some embodiments of posts used in connection with the EMI grounding unit of FIG. 1.
Figure 2B:
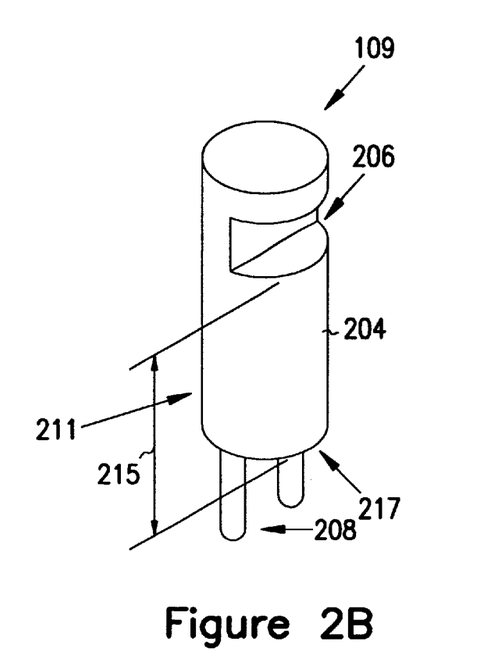
Figure 2C:
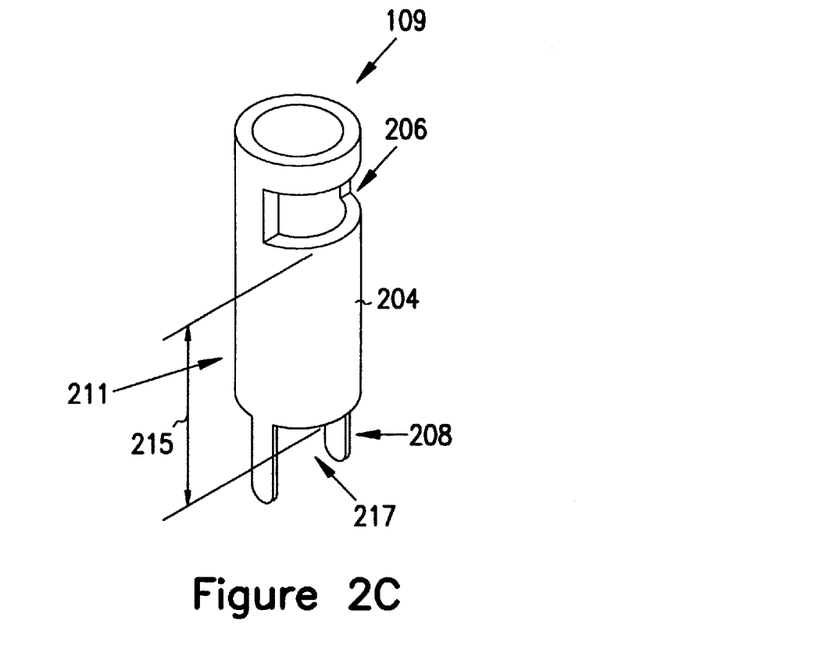
Figure 2D:
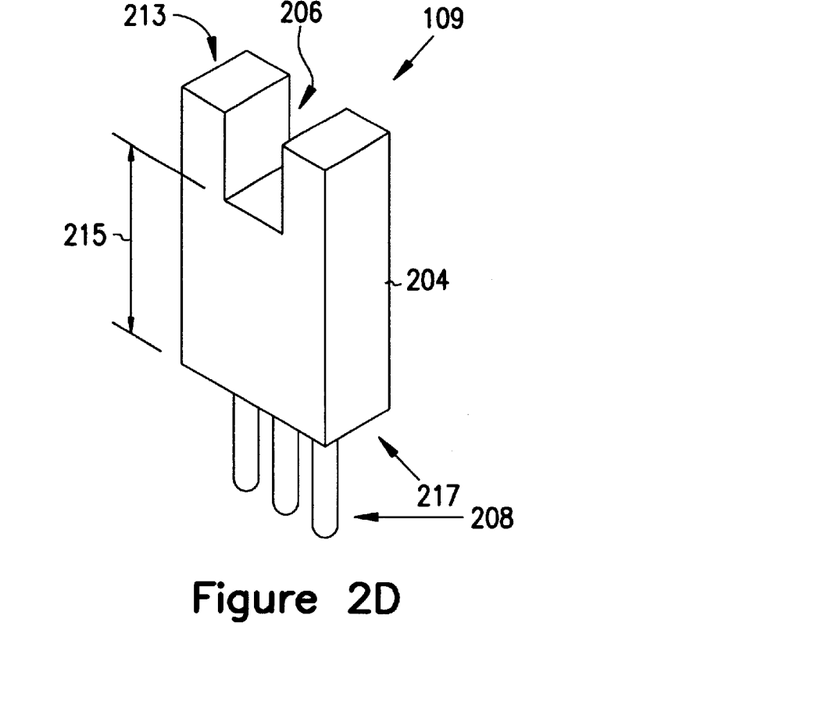

The body 204 of each of the one or more posts 109 is not limited to a particular shape. Preferably, the shape of each of the one or more posts 209 is an easily manufacturable shape. Exemplary shapes that are easily manufacturable include but are not limited to squares, rectangles, cylinders, and hollow cylinders. FIGS. 2A and 2D show exemplary embodiments of one of the one or more posts 109 having a substantially rectangular body. FIG. 2B shows an exemplary embodiment of one of the one or more posts 109 having a solid substantially cylindrical body. FIG. 2C shows an exemplary embodiment of one of the one or more posts 109 having a hollow substantially cylindrical body.

The body 204 of each of the one or more posts 109 is fabricated from a conductive material, such as a metal or a conductive plastic or composite. Exemplary metals suitable for use in the fabrication of each of the one or more posts 109 include aluminum, copper, silver, gold or alloys of aluminum, copper silver or gold.

Each of the exemplary embodiments of one the one or more posts 109 shown in FIGS. 2A–2D includes a notch 206. In one embodiment, the notch 206 is located on a side 211 of the body 204, as shown in FIGS. 2A–2C. In an alternate embodiment, the notch 206 is located on an end 213 of the body 204, as shown in FIG. 2D. The notch 206 is located at a distance 215 above a base 217 of each of the one or more posts 109. The distance 215 is selected to be sufficient to permit the mounting of components on the substrate 115 below the notch 206. The notch 206 is preferably machined from the body 204, but stamping and punching are suitable alternative methods of forming the notch 206. The dimensions of the notch are selected to permit the notch 206 to mate easily with the electrically conductive generally planar member 103 and to provide a structurally solid base for mounting the electrically conductive generally planar member 103.

Each of the one or more leads 208, shown in FIGS. 2A–2D, is located at an end of the body 204 of each of the one or more posts 109. In one embodiment, each of the one or more leads 208 is machined from metal at the end of the body 204. In an alternate embodiment, each of the one or more leads 208 is fabricated separately and attached to the body 204 by a suitable attachment method, such as press-fitting, soldering, or welding. Each of the one or more leads 208 is preferably fabricated from a conductive material, such as a metal. Exemplary metals suitable for use in the fabrication of the one or more leads 208 include copper, silver, gold, or aluminum and alloys of copper, silver, gold, or aluminum. Each of the one or more leads 208 is preferably shaped as a connector pin, which is generally a conductive cylinder, suitable for through-hole mounting or surface mounting.

Referring to FIG. 1, the preferred configuration of the one or more posts 109 comprises eight posts mounted around the sides of the die 111. In one embodiment, two of the one or more posts 109 are mounted on each side of the die 111. In this embodiment, the EMI grounding unit 100 is capable of suppressing high frequency EMI. The required number of the one or more posts 109 mounted around the die 111 increases as the EMI frequencies increase. The one or more posts 109 are typically mounted on the substrate 115 by soldering each of the one or more posts 109 to one of the one or more ground connections 117. In one embodiment, each of the one or more posts 109 extends outward from the surface of the substrate 115.

As can be seen in FIG. 1, the placement of the one or more posts 109 on the substrate 115 is not limited to a particular configuration. In one embodiment, the one or more posts 109 are spaced substantially symmetrically around the generally planar member 103. However, the present invention is not limited to this placement. As can be seen in FIG. 1, the one or more posts 109 may easily be placed asymmetrically around the generally planar member 103. This flexibility in locating the one or more posts 109 in assembling the EMI grounding unit 100 provides significant latitude in placing other components (not shown) on the substrate 115. This latitude in placing other components on the substrate 115 permits packing more components on the substrate 109 than would be possible if the one or more posts 109 were confined to particular locations on the substrate 115.

Figure 3A:
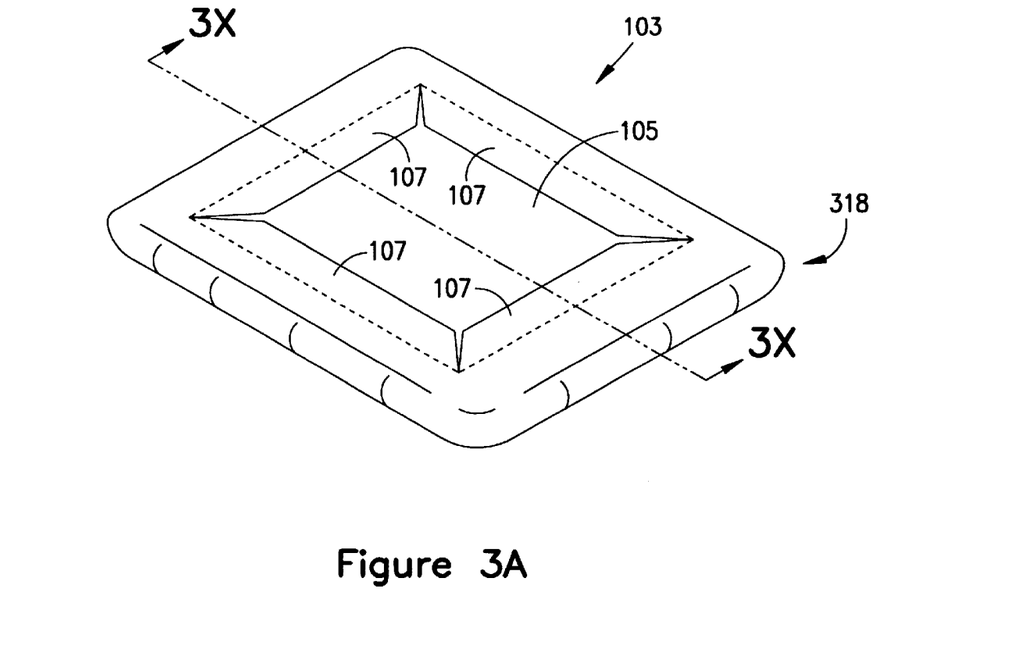
FIG. 3A is a perspective view of one embodiment of an electrically conductive generally planar member and tabs shown in FIG. 1.

FIG. 3A is a perspective view of one embodiment of the electrically conductive generally planar member 103 and the one or more tabs 107. The generally planar member 103, in one embodiment, includes a folded edge 318.

Referring again to FIG. 1, the central aperture 105 allows the generally planar member 103 and the one or more tabs 107, when assembled with the die 111, the substrate 115, and the one or more posts 109, to surround the periphery of the die 111, while the heat sink 113 is in thermal contact with the die 111. Each of the one or more tabs 107 provides electrical contact between the electrically conductive generally planar member 103 and the heat sink 113. The folded edge 318 mechanically and electrically couples the electrically conductive generally planar member 103 to the one or more posts 109.

The electrically conductive generally planar member 103 and the one or more tabs 107 are preferably fabricated from a conductive material, such as a metal or a conductive epoxy or plastic. Exemplary metals suitable for use in the fabrication of the electrically conductive generally planar member 103 and the one or more tabs 107 include but are not limited to aluminum, copper, silver, and alloys of aluminum, copper, or silver. The electrically conductive generally planar member 103 and the one or more tabs 107 are typically formed by a stamping operation. The starting material for the stamping operation is preferably sheet stock. In one embodiment, the stamping operation cuts the sheet stock into a plate having a substantially rectangular shape. The stamping operation also cuts an aperture in the plate, bends the one or more tabs 107 at the central aperture 105 to an angle of between about 10 degrees and about 60 degrees with respect to the central aperture 105, and shapes the folded edge 318 to have a slightly curved member 319, as shown in FIG. 3B.

Figure 3B:
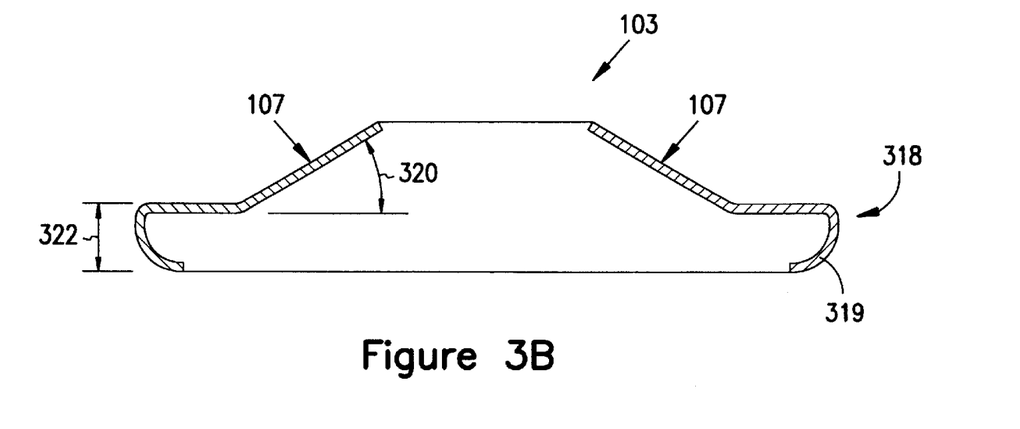
FIG. 3B is a cross-sectional view of the electrically conductive generally planar member and tabs shown in FIG. 3A taken along the line 3X—3X of FIG. 3A.

FIG. 3B is a cross-sectional view of the electrically conductive generally planar member 103 and the one or more tabs 107 taken through line 3X—3X of FIG. 3A. Each of the one or more tabs 107 is preferably shaped as a trapezoid. To provide for continuous contact between the electrically conductive generally planar member 103, the one or more tabs 107, and the heat sink 113, each of the one or more tabs 107 is flexible and slopes upward with a non-zero slope 320 from the aperture 105. The slope 320 is preferably between about 10 degrees and about 60 degrees with respect to the aperture 105.

Figure 4A:
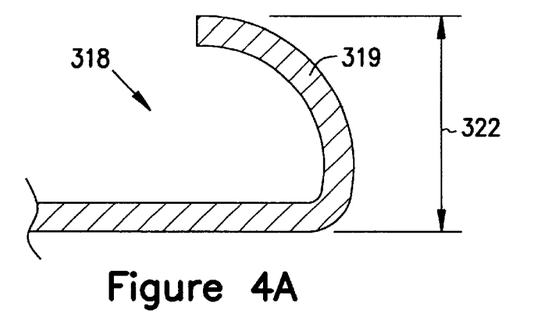
FIG. 4A is a magnified view of one embodiment of a folded edge of the electrically conductive generally planar member shown in FIG. 3B.
Figure 4B:
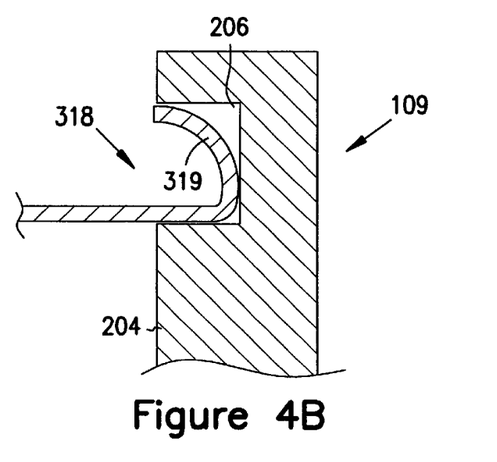
FIG. 4B is a magnified view of one embodiment of the folded edge, which is shown in FIG. 4A, coupled to one of the posts shown in FIGS. 2A–2C.

FIG. 4A is a magnified view of one embodiment of the folded edge 318. In one embodiment, the thickness 322 of the folded edge 318 is selected to provide a press fit of the folded edge 318 into the notch 206 (shown in FIGS. 2A–2C). The slightly curved member 319 provides a constant force on the electrically conductive generally planar member 103 when inserted into the notch 206 of one of the one or more posts 109, as shown in FIG. 4B.

Figure 4C:
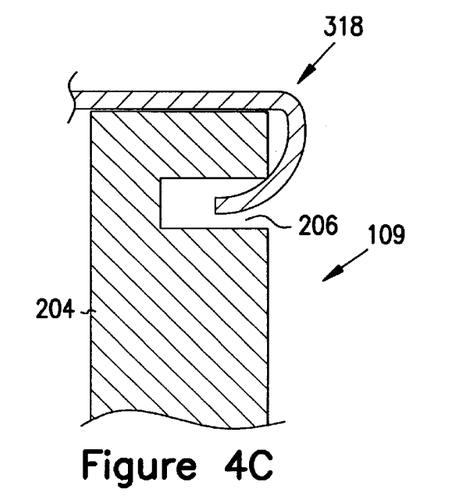
FIG. 4C is a cross-sectional view of an alternate embodiment of the folded edge, which is shown in FIG. 4A, coupled to one of the posts shown in FIGS. 2A–2C.

FIG. 4C is a magnified view of an alternate embodiment of the folded edge 318, which is shown in FIG. 4A, coupled to a post. In this embodiment, the notch 206 in each of the one or more posts 109 is located on a side of each of the one or more posts 109 opposite from the electrically conductive generally planar member 103. When the folded edge 318 is inserted into the notch 206, the electrically conductive generally planar member 103 extends over the top of the one or more posts 109, and the folded edge 318 extends downward and inward into the notch 206.

Figure 5A:
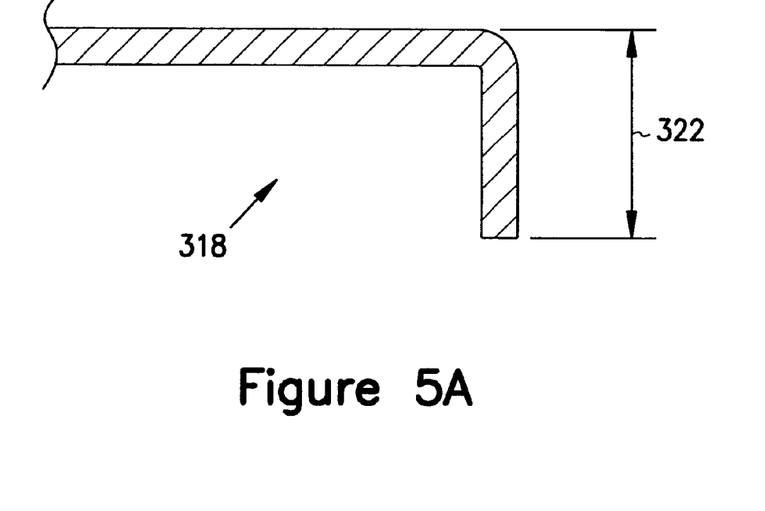
FIG. 5A is a magnified view of an alternate embodiment of the folded edge of the electrically conductive generally planar member shown in FIG. 3B.
Figure 5B:
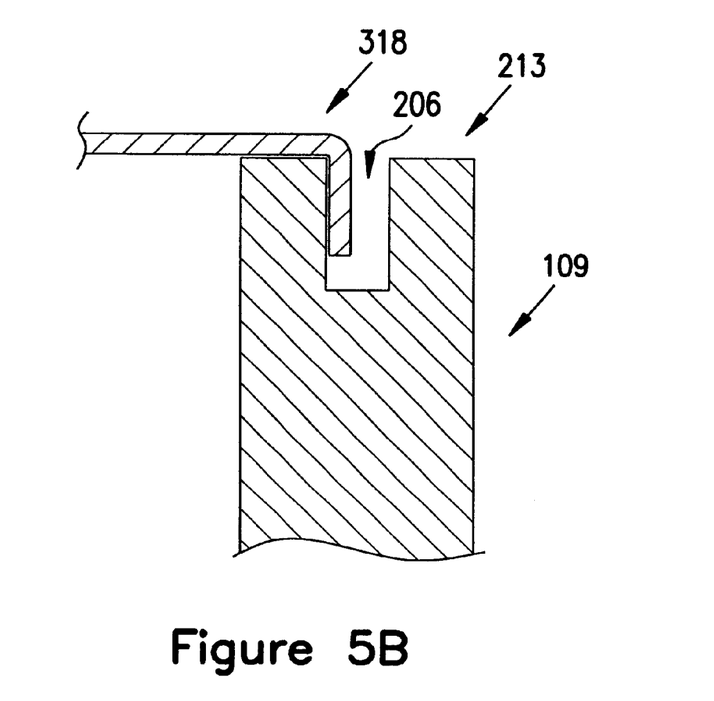
FIG. 5B is a cross-sectional view of one embodiment of the folded edge, which is shown in FIG. 5A, coupled to the post shown in FIG. 2D.

FIG. 5A is magnified view of an alternate embodiment of a folded edge 318. In this embodiment, the folded edge 318 of the electrically conductive generally planar member 103 extends downward and is inserted into the notch 206 located on the end 213 of the one or more posts 109, as shown in FIG. 5B.

Figure 6A:
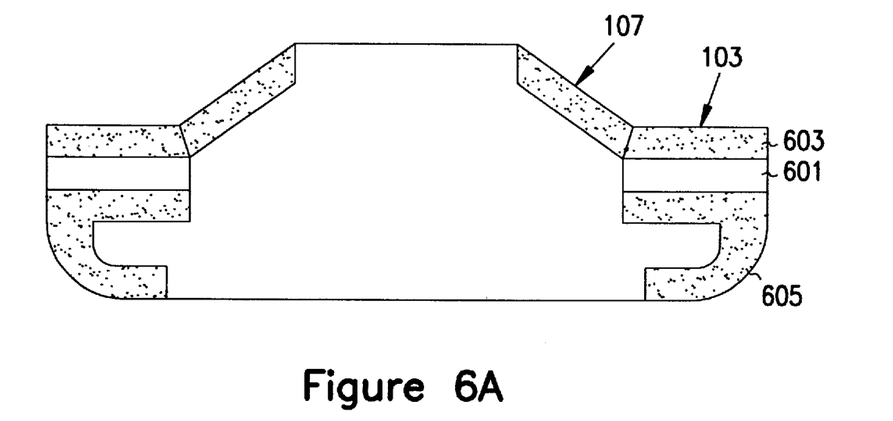
FIG. 6A is a cross-sectional view of an alternate embodiment of the electrically conductive generally planar member and tabs shown in FIG. 3A taken along the line 3X—3X of FIG. 3A.

FIG. 6A shows an alternate embodiment of the electrically conductive generally planar member 103 coupled to the tab 107. The electrically conductive generally planar member 103 comprises a dielectric layer 601, a first conductive member 603, and a second conductive member 605. The dielectric layer 601 is located between the first conductive member 603 and the second conductive member 605. The dielectric layer 601 is fabricated from a dielectric material, however the dielectric layer 601 is not limited to being fabricated using a particular dielectric material. Any material that is capable of functioning as a dielectric in a capacitor is suitable for use in forming the dielectric layer 601. In one embodiment, the dielectric layer 601 is formed from FR4. In an alternate embodiment, the dielectric 601 is formed from a plastic.

The first conductive member 603 and the second conductive member 605 are preferably formed from a conductive material, such as a metal or a conductive epoxy. However, the first conductive member 603 and the second conductive member 605 are not limited to being formed from a particular conductive material or from the same conductive material. In one embodiment, the first conductive member 603 is formed from copper, and the second conductive member 605 is formed from copper. In an alternate embodiment, the first conductive member 603 is formed from a conductive epoxy, and the second conductive member 605 is formed from aluminum.

Figure 6B:
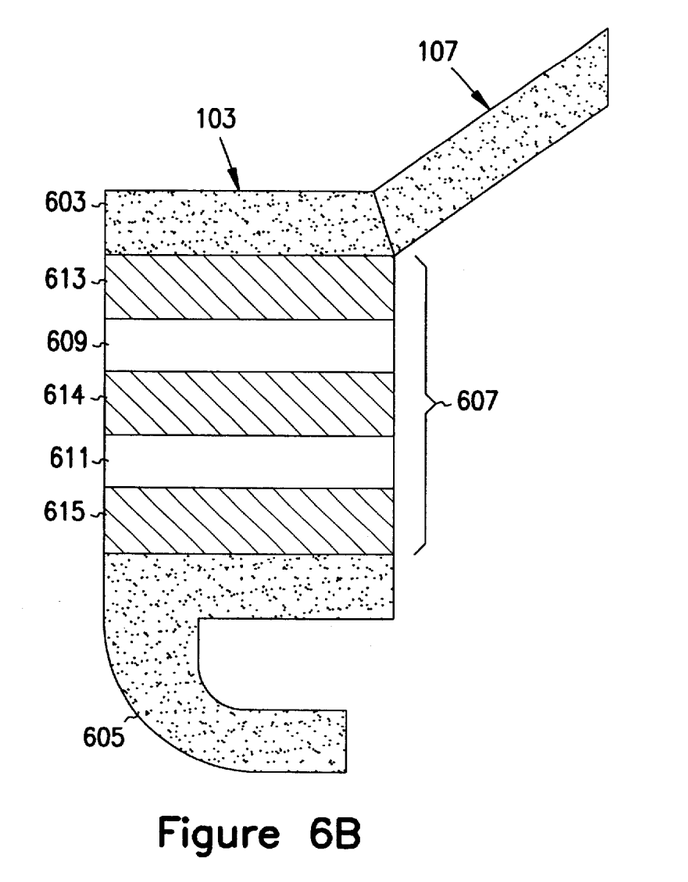
FIG. 6B is an illustration showing a magnified view of one embodiment of a capacitive element included in an electrically conductive generally planar member.

FIG. 6B shows a magnified illustration of a capacitive element 607 included in alternate embodiment of the electrically conductive generally planar member 103. In this embodiment, the electrically conductive generally planar member 103 includes the capacitive element 607, the first conductive member 603, and the second conductive member 605. The capacitive element 607 is located between the first conductive member 603 and the second conductive member 605.

The capacitive element 607, in one embodiment, includes a plurality of dielectric layers 609 and 611 and three or more conductive layers 613–615. The dielectric layer 609 is located between the conductive layers 613 and 614, and the dielectric layer 611 is located between the conductive layers 614 and 615. The dielectric layers 609 and 611 are not limited to being fabricated from a particular material. Any material that is capable as functioning as a dielectric in a capacitor is suitable for use in fabricating the dielectric layers 609 and 611. In one embodiment the dielectric layers 609 and 611 are fabricated from FR4. In an alternate embodiment, the dielectric layers 609 and 611 are fabricated from a plastic.

The conductive layers 613–615 are preferably fabricated from a conductive material, such as a metal or conductive plastic. In one embodiment, the conductive layers 613–615 are fabricated from copper. In an alternate embodiment, the conductive layers 613–615 are fabricated from gold. The conductive layers 613 and 615 are electrically coupled to the first conductive member 603 and the second conductive member 605, respectively. The dielectric layers 613 and 615 are not limited to being coupled to the first conductive member 603 and the second conductive member 605 using a particular method. In one embodiment, the conductive layer 613 is soldered to the first conductive member 603, and the conductive layer 615 is soldered to the conductive layer 615.

Figure 6C:
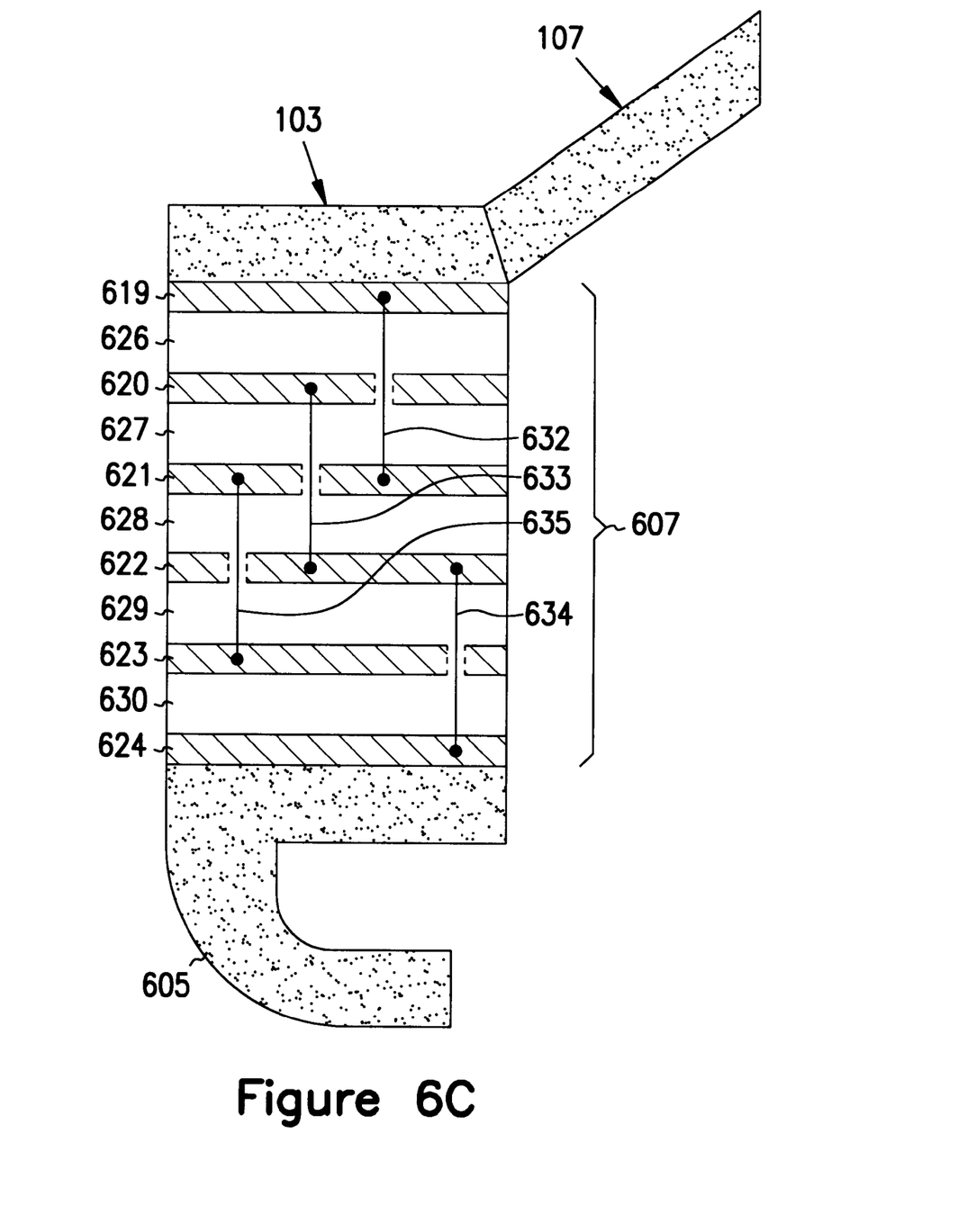
FIG. 6C is an illustration showing a magnified view of an alternate embodiment of a capacitive element included in an electrically conductive generally planar member.

FIG. 6C shows a magnified illustration of an alternate embodiment of the capacitive element 607. In this embodiment, the capacitive element 607 includes a plurality of conductive layers 619–624, a plurality of dielectric layers 626–630, and one or more conductive interconnects 632–635. In this embodiment, the conductive layers 619–624 alternate with the dielectric layers 626–630 in a stack. The conductive layer 619 is electrically coupled to the conductive layer 621 through a conductive interconnect 632 which passes through and is insulated from conductive layer 620. The conductive layer 620 is coupled to the conductive layer 622 through a conductive interconnect 633 which passes through and is insulated from the conductive layer 621. The conductive layer 624 is electrically coupled to the conductive layer 622 through a conductive interconnect 634 which passes through and is insulated from the conductive layer 623. The conductive layer 623 is coupled to the conductive layer 621 through a conductive interconnect 635 which pass through and is insulated from the conductive layer 621. Methods of insulating conductive interconnects from the conductive layers which the conductive interconnects pass through are well known in the art. Stacking alternating layers of dielectrics and conductors assists in creating a large capacitance in a small volume.

The conductive layers 619–624 are preferably fabricated from an electrically conductive material. However, the conductive layers 619–624 are not limited to being fabricated from a particular conductive material. In one embodiment, each of the conductive layers 619–624 is fabricated from a metal. In an alternate embodiment, each of the conductive layers 619–624 is fabricated from a conductive polymer. The dielectric layers 626–630 are preferably fabricated from a high dielectric constant material. However, the dielectric layers 626–630 are not limited to being fabricated from a particular dielectric material. In one embodiment, each of the dielectric layers is fabricated from FR4. The conductive interconnects are preferably fabricated from a conductive material, such as a metal. However, the conductive interconnects 632–635 are not limited to being fabricated from a particular conductive material or a particular metal. In one embodiment, the conductive interconnects 632–635 are fabricated from copper. In an alternate embodiment, the conductive interconnects 632–635 are fabricated from gold.

In operation, the capacitive element 607 described above permits tuning (by varying the capacitance of the capacitive element 607) of a circuit comprised of the heat sink 113 (shown in FIG. 1), the one or more tabs 107 (shown in FIG. 1), the electrically conductive generally planar member 103 (shown in FIG. 1), and the one or more posts 109 (shown in FIG. 1) to efficiently couple currents of different frequencies from the heat sink 103 to the ground 119 (shown in FIG. 1). The capacitance of the capacitive element 607 is selected through simulation of the circuit or empirically through testing the circuit by bombarding the heat sink 113 with EMI of a known frequency and energy.

Figure 7:
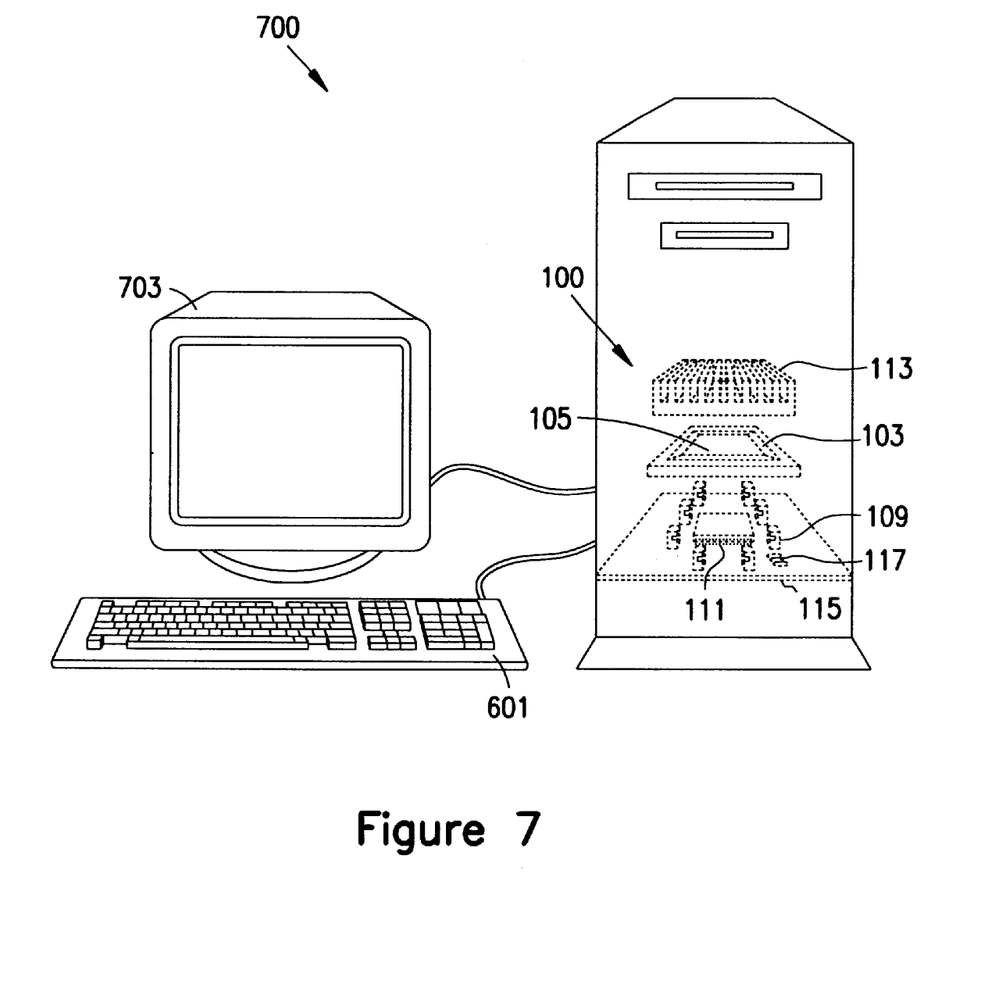
FIG. 7 is an illustration of a computer system including an EMI grounding unit according to the present invention.

FIG. 7 is an illustration of one embodiment of a personal computer 700 suitable for use in connection with the present invention. The personal computer 700 includes a keyboard 701, a monitor 703, and the EMI grounding unit 100 including the substrate 115 having the one or more ground connections 117, the die 111, the heat sink 113, the one or more posts 109, and the electrically conductive generally planar member 103. In one embodiment, the keyboard 701 and the monitor 703 are coupled to the substrate 115. The die 111, which includes a processor, such as a microprocessor, is coupled to the keyboard 701 and the monitor 703 through interconnects on the substrate 115.

Referring again to FIG. 1, the EMI grounding unit 100 is assembled by attaching the die 111 to the substrate 115 and attaching each one of the one or more posts 109 to one of the one or more ground connections 117. The electrically conductive generally planar member 103 is inserted into each of the one or more posts 109 and the spring pressure in folded edge 318 maintains surface contact between the electrically conductive generally planar member 103 and the one or more posts 109. The heat sink 113 is thermally coupled to the die 111 and makes electrical and mechanical contact with each of the one or more tabs 107. Spring pressure in the one or more tabs 107 provides a force that maintains electrical contact between the heat sink 113 and the one or more tabs 107.

Still referring to FIG. 1, in operation, EMI is generated at the die 111 and the substrate 115. The EMI is absorbed by the heat sink 113 and coupled through the tabs 105 and the electrically conductive generally planar member 103 to the one or more ground connections 117 on the substrate 115. The EMI ground unit 100 thus effectively suppress the re-radiation of EMI from the heat sink 113.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. An electromagnetic interference (EMI) grounding unit comprising:
   an electrically conductive generally planar member having a central aperture;
   one or more posts mechanically mounted to a substrate having a ground and the one or more posts electrically connected to the ground, the one or more posts engaging the electrically conductive generally planar member to space the electrically conductive generally planar member from and above the substrate and to position the aperture over and in alignment with a die mounted on the substrate; and one or more tabs electrically and mechanically continuous with the electrically conductive generally planar member, the one or more tabs effecting and maintaining electrical contact with a heat sink thermally coupled to the die.

2. The EMI grounding unit of claim 1, wherein the electrically conductive generally planar member comprises a metal.

3. The EMI grounding unit of claim 1, wherein the electrically conductive generally planar member comprises:
at least one folded edge capable of being coupled to at least one of the one or more posts.

4. The EMI grounding unit of claim 1, wherein each of the one or more tabs extends over the aperture, each of the one or more tabs being flexible relative to the electrically conductive generally planar member and normally extending upwardly away from the electrically conductive generally planar member, each of the one or more tabs being flexed out of a normal position when contacted by the heat sink as the heat sink is moved into thermal contact with the die at the aperture.

5. The EMI grounding unit of claim 1, the tab has a slope of between about 10 degrees and about 60 degrees with respect to the aperture.

6. The EMI grounding unit of claim 1, wherein the electrically conductive generally planar member comprises:
a first conductive member;
a second conductive member; and
a dielectric layer located between the first conductive member and the second conductive member.

7. The EMI grounding unit of claim 1, wherein the electrically conductive generally planar member comprises:
a first conductive member;
a second conductive member; and
a capacitive element located between the first conductive member and the second conductive member.

8. The EMI grounding unit of claim 2, wherein the metal comprises copper.

9. The EMI grounding unit of claim 8, wherein the central aperture is substantially rectangular.

10. The EMI grounding unit of claim 3, wherein the at least one folded edge includes a slightly curved member.

11. The EMI grounding unit of claim 4, wherein the each of the one or more tabs has a substantially trapezoidal shape.

12. An apparatus comprising:
an electrically conductive generally planar member having a central aperture; and
a tab which is electrically and mechanically continuous with the electrically conductive generally planar member and which forms an angle of between about 10 degrees and about 60 degrees with the aperture, wherein the electrically conductive generally planar member comprises:
a first conductive member;
a second conductive member; and
a dielectric layer located between the first conductive member and the second conductive member.

13. The apparatus of claim 12, wherein the central aperture is substantially rectangular.

14. The apparatus of claim 12, wherein the electrically conductive generally planar member has a folded edge.

15. The apparatus of claim 12, wherein the tab has a substantially trapezoidal shape.

16. The apparatus of claim 14, wherein the folded edge includes a slightly curved member.

17. An apparatus comprising:
an electrically conductive generally planar member having a central aperture; and
a tab which is electrically and mechanically continuous with the electrically conductive generally planar member and which forms an angle of between about 10 degrees and about 60 degrees with the aperture, wherein the electrically conductive generally planar member comprises:
a first conductive member;
a second conductive member; and
a capacitive element located between the first conductive member and the second conductive member.

18. The apparatus of claim 17, wherein the central aperture is substantially rectangular.

19. The apparatus of claim 17, wherein the electrically conductive generally planar member has a folded edge.

20. The apparatus of claim 17, wherein the tab has a substantially trapezoidal shape.

21. The apparatus of claim 19, wherein the folded edge includes a slightly curved member.

22. An apparatus comprising:
an electrically conductive generally planar member having a central aperture; and
a tab which is electrically and mechanically continuous with the electrically conductive generally planar member and which forms an angle of between about 10 degrees and about 60 degrees with the aperture, wherein the electrically conductive generally planar member comprises:
a first conductive member;
a second conductive member; and
a capacitive element located between the first conductive member and the second conductive member, wherein the capacitive element comprises:
a stack comprising four or more conductive layers alternating with dielectric layers, wherein at least two of the conductive layers are electrically coupled together by a conductive interconnect.

23. A method of assembling an electromagnetic interference (EMI) grounding unit, the method comprising:
mounting a die on a substrate having a ground;
connecting a post having a notch to the ground on the substrate;
attaching an electrically conductive generally planar member having a folded edge to the post by inserting the folded edge of the electrically conductive generally planar member into the notch; and
attaching a heat sink to the die such that the heat sink makes electrical contact with a tab which is electrically and mechanically continuous with the electrically conductive generally planar member.

24. The method of claim 23, wherein connecting a post having a notch to the ground on the substrate comprises:
soldering the post to a ground connection on the substrate.

25. The method of claim 23, wherein connecting a post having a notch to the ground on the substrate comprises:
press-fitting the post to a ground connection on the substrate.

26. A computer system comprising:
an electrically conductive generally planar member having a central aperture;
one or more posts mechanically mounted to a printed circuit board having a ground and the one or more posts electrically connected to the ground, each of the one or more posts having a notch and engaging the electrically conductive generally planar member to space the electrically conductive generally planar member from and above the substrate and to position the aperture over and in alignment with a die having a processor, the die mounted on the substrate;

a tab which is electrically and mechanically continuous with the electrically conductive generally planar member, the tab effecting and maintaining electrical contact with a heat sink thermally coupled to the die;

a monitor capable of being coupled to the printed circuit board; and a keyboard capable of being coupled to the printed circuit board.

27. The computer system of claim 26, wherein each tab is folded to an angle of between about 10 degrees and about 60 degrees with respect to the central aperture.

28. The computer system of claim 26, wherein at least one of the one or more posts has an end and the notch is formed on the end.

* * * * *